United States Patent
Lee et al.

(10) Patent No.: US 7,477,558 B2
(45) Date of Patent: Jan. 13, 2009

(54) SEMICONDUCTOR MEMORY DEVICE, A LOCAL PRECHARGE CIRCUIT AND METHOD THEREOF

(75) Inventors: Soon-Seob Lee, Seongnam (KR); Dae-Joon Kim, Yongin (KR); Dong-Ho Hyeon, Suwon (KR)

(73) Assignee: Samsung Electronics O., Ltd., Gyeonggi-do (KR)

( * ) Notice: Subject to any disclaimer, the term of this patent is extended or adjusted under 35 U.S.C. 154(b) by 39 days.

(21) Appl. No.: 11/523,052

(22) Filed: Sep. 19, 2006

(65) Prior Publication Data

US 2007/0280018 A1     Dec. 6, 2007

(30) Foreign Application Priority Data

May 30, 2006   (KR) .................... 10-2006-0048455

(51) Int. Cl.
*G11C 7/00*     (2006.01)
(52) U.S. Cl. .............. 365/203; 365/230.03; 365/207; 365/233.1
(58) Field of Classification Search .............. 365/203, 365/130.03, 207, 233, 190
See application file for complete search history.

(56) References Cited

U.S. PATENT DOCUMENTS

| | | | | |
|---|---|---|---|---|
| 6,141,275 A * | 10/2000 | Tsai et al. | ..................... | 365/203 |
| 6,903,988 B2 * | 6/2005 | Lee | ........................... | 365/205 |
| 6,954,389 B2 * | 10/2005 | Nakamura | .................. | 365/205 |
| 7,180,817 B2 * | 2/2007 | Mochida | ................. | 365/230.03 |
| 7,206,216 B2 * | 4/2007 | Osada et al. | ................. | 365/148 |
| 7,266,030 B2 * | 9/2007 | Do et al. | ..................... | 365/207 |
| 2006/0028888 A1 * | 2/2006 | Shin et al. | ................... | 365/205 |

* cited by examiner

*Primary Examiner*—David Lam
(74) *Attorney, Agent, or Firm*—Harness, Dickey & Pierce, P.L.C.

(57) ABSTRACT

A semiconductor memory device, a local precharge circuit and a method thereof are provided. The example semiconductor memory device may include a local input/output line connected to a bit line coupled with a memory cell, through a column selection transistor, the local input/output line providing a transmission path on which to transmit a data signal through the bit line to a local sense amplifier and a local precharge circuit configured to adjust a precharge voltage level of the local input/output line based on a status of an active mode and a status of a column selection signal. The active mode may be a period where a word line is enabled. The example local precharge circuit may be included within the example semiconductor memory device.

23 Claims, 6 Drawing Sheets

SEMICONDUCTOR MEMORY DEVICE, A LOCAL PRECHARGE CIRCUIT AND METHOD THEREOF

This U.S. nonprovisional patent application claims priority under 35 U.S.C. §119 of Korean Patent Application 10-2006-0048455 filed on May 30, 2006, the contents of which is hereby incorporated by reference in its entirety.

BACKGROUND OF THE INVENTION

1. Field of the Invention

Example embodiments of the present invention relate generally to a semiconductor memory device, a local precharge circuit and method thereof, and more particularly to a semiconductor memory device, a local precharge circuit and method of performing a precharge operation.

2. Description of the Related Art

In a conventional semiconductor memory device, a bit line or local input/output line may be precharged to a precharge voltage level in order to reduce an occurrence of "floating" and to increase a sensing speed during a period when read and/or write operations are not actively performed. The precharge voltage level may be substantially the same as a bit line precharge voltage VBL, where the precharge voltage VBL may correspond to half of a power source voltage VINT or cell array operating voltage VINTA. The cell array operating voltage VINTA may be slightly less than or equal to the power source voltage VINT. The cell array operating voltage VINTA may be used to indicate a first logic level (e.g., a higher logic level or logic "1") of data stored in a memory cell.

However, if a local sense amplifier is connected to a local input/output line and the local input/output line is precharged, different precharge voltage levels may be applied so as to increase a sensing speed of the local sense amplifier. Thus, if a local input/output line LIO, LIOB set to a voltage level VINTA, VSS is precharged to a first voltage level VBL, a noise source may be generated which may vary a voltage level of the first voltage level VBL based on the precharge operation of the local input/output line LIO, LIOB. The noise source may affect an operation of a first level VBL voltage generating circuit and may reduce a data sensing efficiency of the memory cell.

In order to compensate for the aforementioned noise source phenomenon, before a read or write operation to a memory cell begins (e.g., before an active mode is initiated), a precharge operation may be performed with a voltage set to the same level as a bit line precharge voltage. Then, a word line may be enabled and the active mode may be initiated, and the precharge operation may be performed with a voltage set to the same level as a cell array operating voltage VINTA. When the active mode completes, a precharge may again be performed with a voltage at the same level VBL as a bit line precharge voltage.

FIG. 1 illustrates a voltage level variation of a bit line and a local input/output line during a conventional precharge and data sensing operation.

Referring to FIG. 1, the local input/output line LIO, LIOB may be precharged to a first level VBL before an active mode is initiated. A word line WL connected to a memory cell may be enabled to read data of the memory cell, and the active mode may initiate. When the active mode is initiated, the local input/output line LIO, LIOB may be precharged to a second level VINTA. The precharge operation of the local input/output line LIO, LIOB to the second voltage level VINTA may continue until the word line is disabled and the active mode completes. However, while data is being transmitted to the local input/output line LIO, LIOB through bit line BL, BLB, the precharge of the local input/output line LIO, LIOB may not be performed. In other words, if a column address strobe (CAS) signal is applied and a column selection signal CSL is enabled such that column selection transistors connected between the bit line BL, BLB and the local input/output line LIO, LIOB are turned on, a precharge circuit for the local input/output line LIO, LIOB may not be operated. Voltage corresponding to data may be provided to the local input/output line, and the precharge enable signal may be disabled. After waiting for the active mode (e.g., a mode wherein data may be transmitted on the I/O line) to complete, the local input/output line LIO, LIOB may again be precharged to the first voltage level VBL.

A conventional semiconductor memory device performing the precharge operation described above will now be described in greater detail.

In the conventional semiconductor memory device, the local input/output line LIO, LIOB may be precharged to the second voltage level VINTA before the column selection signal CSL may be enabled in an active mode to perform a read operation. The column selection signal CSL may be enabled such that the bit line BL, BLB and the local input/output line LIO, LIOB may be electrically connected with each other. Thus, charge sharing may occur between the bit line BL, BLB and the local input/output line LIO, LIOB.

Because main local input/output line LIO and sub local input/output line LIOB are precharged to the second voltage level VINTA, voltage levels at the main bit line BL and the sub bit line BLB may increase via the above-described charge sharing, which may be indicated by reference number 30 of FIG. 1, which may thereby cause a data sensing error. For example, in reading data set to the first logic level (e.g., a higher logic level or logic "1"), a voltage level of the main bit line BL may be higher than a voltage level of the sub bit line BLB during normal operation, but if the voltage level of the main bit line BL increases via the charge sharing, the coupling may occur in a higher voltage level state of an adjacent bit line such that a voltage level of the sub bit line BLB may be higher than that of the main bit line BL. A local sense amplifier may thereby sense and amplify an inaccurate value, such that the output data may be inaccurate.

In a semiconductor memory device having a "long" tRCD condition, a delay may be provided until an RAS signal may be applied, and then a CAS signal may be applied, where the tRCD may be indicative of a delay time between receipt of the RAS and CAS signals. A column selection signal CSL may be enabled where a voltage level difference between the main bit line BL and the sub bit line BLB may be relatively large, which may reduce a probability of data failure. However, in a semiconductor memory device having a "short" tRCD condition, the column selection signal CSL may be enabled in a state where a voltage level difference between the main bit line BL and the sub bit line BLB is relatively low, thereby increasing the probability of a data failure (e.g., because noise may cause inaccurate data to be outputted).

SUMMARY OF THE INVENTION

An example embodiment of the present invention is directed to a semiconductor memory device, including a local input/output line connected to a bit line coupled with a memory cell, through a column selection transistor, the local input/output line providing a transmission path on which to transmit a data signal through the bit line to a local sense amplifier and a local precharge circuit configured to adjust a precharge voltage level of the local input/output line based on a status of an active mode and a status of a column selection signal.

Another example embodiment of the present invention is directed to a local precharge circuit for precharging a local input/output line connected between a bit line and a local sense amplifier in a semiconductor memory device, including a precharge unit configured to precharge the local input/output line to a precharge voltage level equal to one of a first voltage level and a second voltage level and a precharge controller configured to control the precharge unit via at least one precharge control signal, the at least one precharge control signal based on a start time and end time of an active mode and a status of a column selection signal.

Another example embodiment of the present invention is directed to a method of precharging a local input/output line connected between a bit line and a local sense amplifier in a semiconductor memory device, including adjusting a precharge voltage level of the local input/output line based on a status of an active mode and a status of a column selection signal, the active mode referring to a period where a word line is enabled.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE INVENTION

Example embodiments of the present invention now will be described more fully hereinafter with reference to the accompanying drawings, in which embodiments of the invention are shown. Example embodiments of the present invention may, however, be embodied in many different forms and should not be construed as limited to the embodiments set forth herein. Rather these example embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Hereinafter, example embodiments of the present invention will be described in detail with reference to FIGS. 2 to 6. It will be understood by those skilled in the art that the present invention can be embodied by numerous different types and is not limited to the following described example embodiments.

Figure 2:
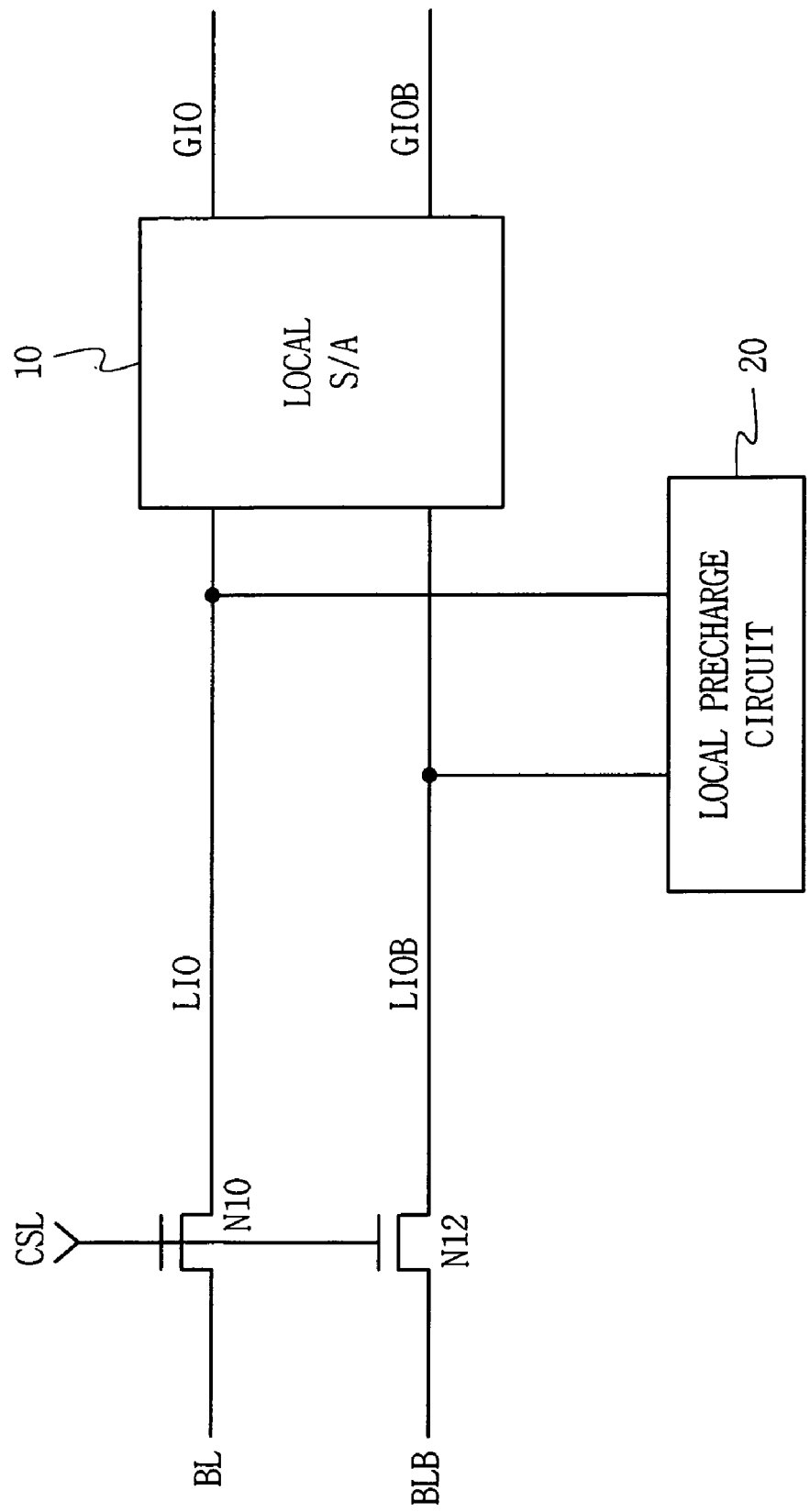
FIG. 2 illustrates a local sense amplifier and a local precharge circuit according to an example embodiment of the present invention.

FIG. 2 illustrates a local sense amplifier 10 and a local precharge circuit 20 according to an example embodiment of the present invention. In the example embodiment of FIG. 2, a local input/output line LIO, LIOB may be coupled between a bit line BL, BLB and the local sense amplifier 10.

In the example embodiment of FIG. 2, the bit line BL, BLB may be connected to the local input/output line LIO, LIOB through column selection transistors N10 and N12, which may be controlled by a column selection signal CSL. If the column selection signal CSL is enabled (e.g., set to a first logic level such as a higher logic level or logic "1", set to a second logic level such as a lower logic level or logic "0", etc.), the column selection transistors N10 and N12 may be turned on, so as to electrically connect the bit line BL, BLB with the local input/output line LIO, LIOB. The local input/output line LIO, LIOB may be directly connected to the local sense amplifier 10. Data sensed in the local sense amplifier 10 may be output to a global input/output line GIO, GIOB. The local input/output line LIO, LIOB may be connected to the local precharge circuit 20 to precharge the local input/output line LIO, LIOB.

Figure 3:
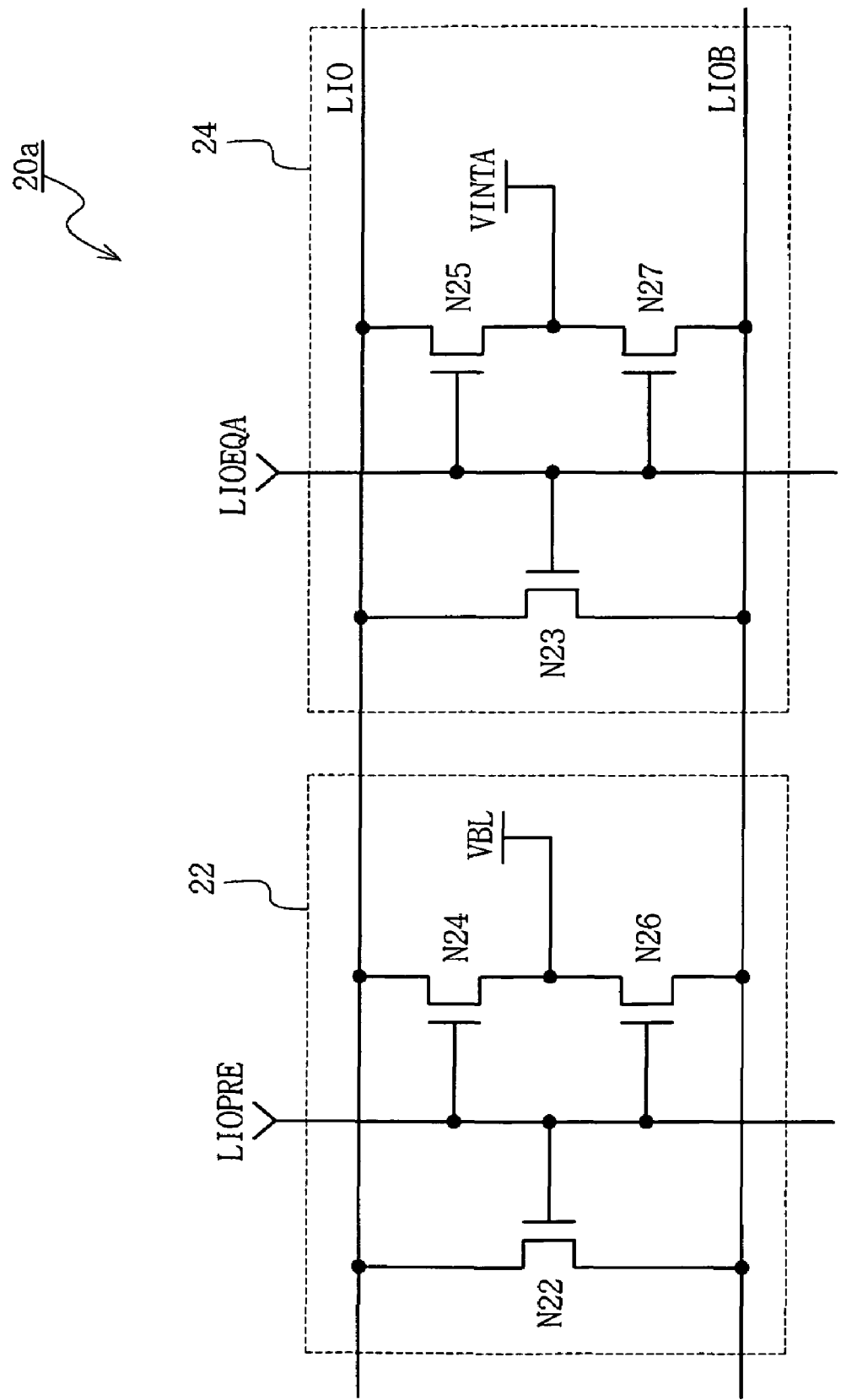
FIGS. 3 and 4 illustrate a precharge unit and a precharge controller, respectively, according to example embodiments of the present invention.
Figure 4:
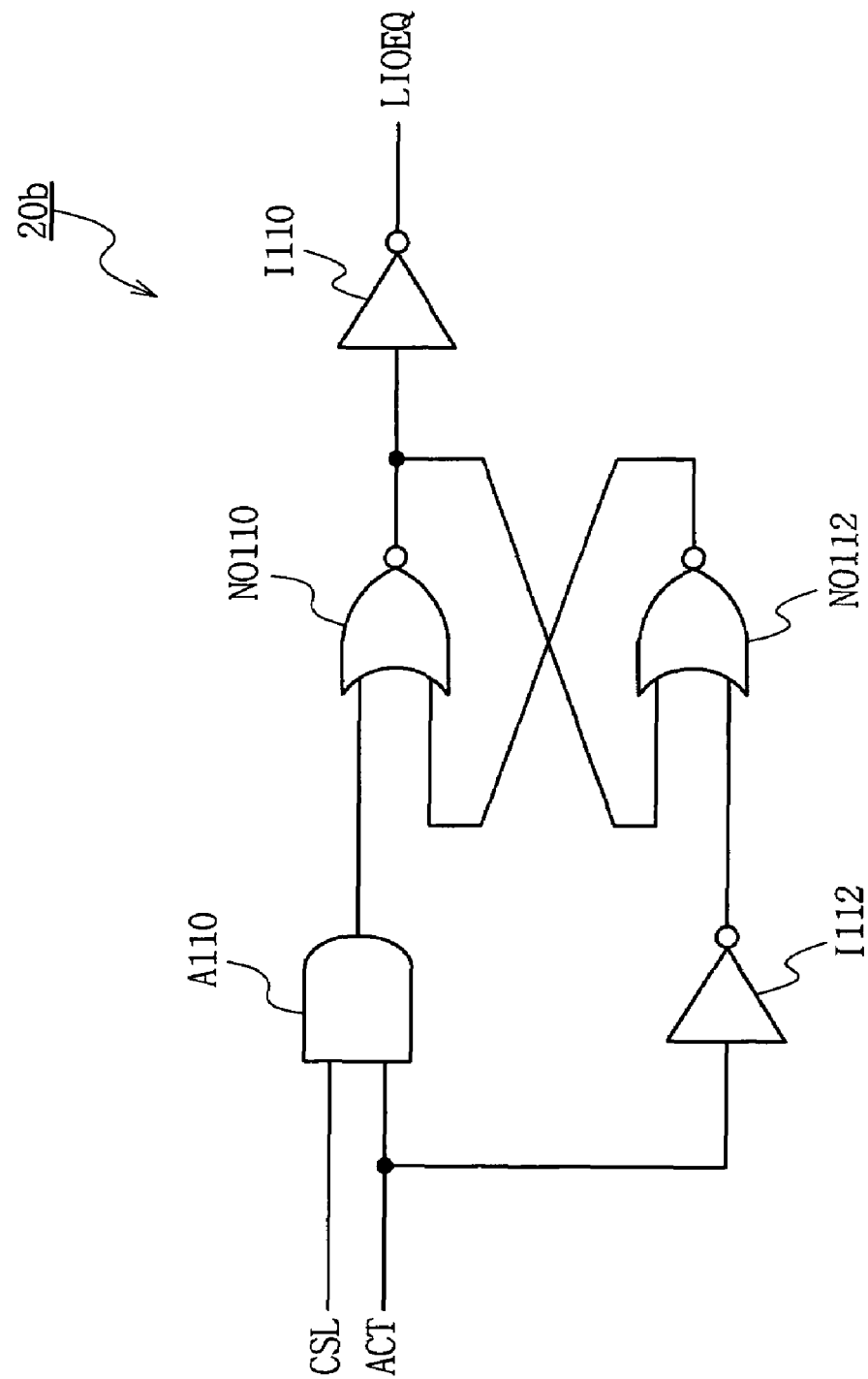

FIGS. 3 and 4 illustrate a precharge unit 20a and a precharge controller 20b, respectively, according to example embodiments of the present invention. In an example, each of the precharge unit 20a and the precharge controller 20b may be included within the local precharge circuit 20 of FIG. 2.

In the example embodiments of FIGS. 3 and 4, the precharge unit 20a may precharge the local input/output line LIO, LIOB to a precharge voltage level (e.g., a first voltage level VBL, a second voltage level VINTA, etc.) via a precharge operation. The precharge controller 20b may control the precharge unit 20a via first and second precharge control signals LIOEQA and LIOPRE, which may vary a precharge voltage level of the local input/output lines LIO and LIOB, respectively.

In the example embodiment of FIG. 3, the precharge unit 20a may operate in response to a precharge enable signal PRECHARGE. The precharge unit 20a may include a first precharge circuit 22 for precharging the local input/output line LIO, LIOB to the first voltage level VBL, and a second precharge circuit 24 for precharging the local input/output line LIO, LIOB to the second voltage level VINTA.

In the example embodiment of FIG. 3, the first precharge circuit 22 may include NMOS transistors N24 and N26 connected in series between the local input/output line LIO, LIOB. The NMOS transistors N24 and N26 may be controlled by the first precharge control signal LIOPRE applied to each gate. The NMOS transistors N24 and N26 apply a precharge voltage set to the first voltage level VBL to the local input/output line LIO, LIOB. Further, the first precharge circuit 22 may include an NMOS transistor N22 with a gate receiving the first precharge control signal LIOPRE and with a source and drain each connected to the local input/output line LIO, LIOB.

In the example embodiment of FIG. 3, the first precharge circuit 22 may precharge the local input/output line LIO, LIOB to the first voltage level VBL if the first precharge control signal LIOPRE is enabled (e.g., set to the first logic level).

In the example embodiment of FIG. 3, the second precharge circuit 24 may include NMOS transistors N25 and N27 connected in series between the local input/output line LIO, LIOB and controlled by a second precharge control signal LIOEQA (e.g., applied to respective gates thereof). The NMOS transistors N25 and N27 may apply a precharge voltage set to the second voltage level VINTA to the local input/output line LIO, LIOB. Further, the second precharge circuit 24 may include an NMOS transistor N23 with a gate receiving the second precharge control signal LIOEQA and a source and drain are each connected to the local input/output line LIO, LIOB.

In the example embodiment of FIG. 3, the second precharge circuit 24 may operate if the second precharge control signal LIOEQA is enabled (e.g., set to the first logic level) in order to precharge the local input/output line LIO, LIOB to the second voltage level VINTA.

In the example embodiment of FIG. 3, the precharge unit 20a may not operate if the precharge enable signal PRECHARGE is disabled (e.g., set to the second logic level), irrespective of whether the first and/or second precharge control signals LIOPRE and LOIEQA are enabled. For example, if the column selection signal CSL is maintained at an enable state, the precharge for the local input/output line LIO, LIOB may not be performed.

In the example embodiment of FIG. 4, the precharge controller 20b may generate a window signal LIOEQ to control a generation of the first and second precharge control signals LIOPRE and LIOEQA based on an active mode status (e.g., an active mode start signal and an active mode completion or end signal) and the column selection signal CSL. The active mode may refer to an operating mode beginning when the word line WL becomes enabled and ending when the word line WL is disabled. In an example, an active mode start signal ACT may alternatively be referred to, and used as, a word line enable signal WL.

In the example embodiment of FIG. 4, the precharge controller 20b may include an AND circuit A110, a NOR circuit NO110, NO112 and an inverter I110, I112. The precharge controller 20b may generate a window signal LIOEQ having an enable period (e.g., beginning when the first column selection signal CSL is enabled and ending when the active mode is disabled).

In the example embodiment of FIG. 4, during the enable period of the window signal LIOEQ, the first precharge control signal LIOPRE may not be enabled, and the second precharge control signal LIOEQA may be enabled. After the enabled period of the window signal LIOEQ (e.g., during a "disabled" period), the first precharge control signal LIOPRE may be enabled, and the second precharge control signal LIOEQA may not be enabled.

Example operation of the precharge controller 20b of FIG. 4 will now be described in greater detail.

In example operation of the precharge controller 20b of FIG. 4, during the enable period of the window signal LIOEQ, the first precharge control signal LIOPRE may be disabled or set to the second logic level (e.g., a lower logic level or logic "0"), and the second precharge control signal LIOEQA may be set to a voltage level of the precharge enable signal PRECHARGE. For example, if the precharge enable signal PRECHARGE is enabled (e.g., set to the first logic level), the second precharge control signal LIOEQA may also be enabled (e.g., set to the first logic level). In another example, if the precharge enable signal PRECHARGE is disabled (e.g., set to the second logic level), the second precharge control signal LIOEQA may also be disabled (e.g., set to the second logic level). During the enable period of the window signal LIOEQ, the second precharge control signal LIOEQA may correspond to the precharge enable signal PRECHARGE.

In example operation of the precharge controller 20b of FIG. 4, during the disabled period of the window signal LIOEQ, the first precharge control signal LIOPRE may be enabled (e.g., set to the first logic level) and the second precharge control signal LIOEQA may be disabled (e.g., set to the second logic level).

Figure 5:
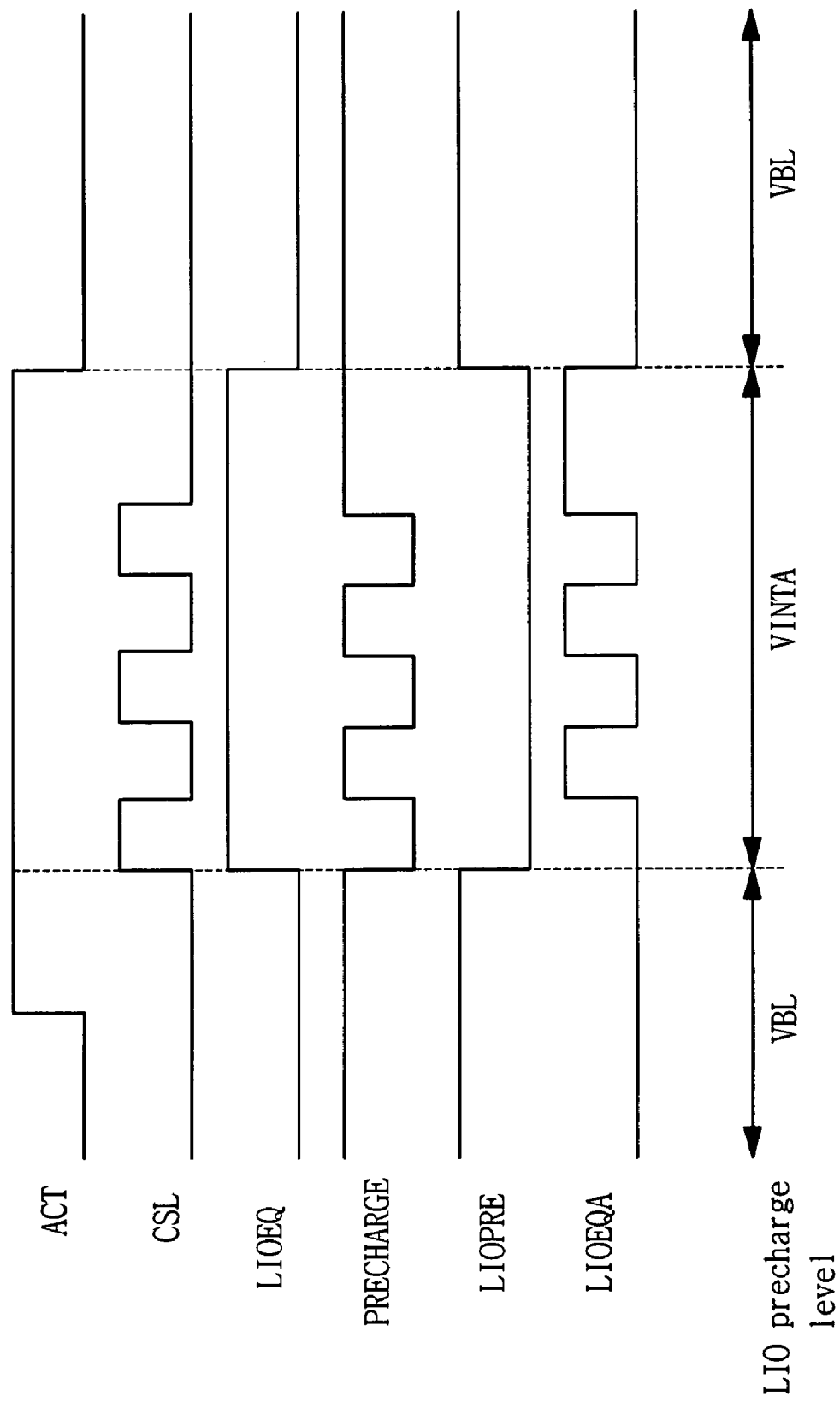
FIG. 5 illustrates timing characteristics associated with the precharge unit and the precharge controller of the example embodiments of FIGS. 3 and 4, respectively.

FIG. 5 illustrates timing characteristics associated with the precharge unit 20a and the precharge controller 20b of the example embodiments of FIGS. 3 and 4, respectively.

In the example embodiment of FIG. 5, before an active mode start signal ACT is set to the first logic level (e.g., a higher logic level or logic "1"), the first precharge control signal LIOPRE may be set to the first logic level, and the second precharge control signal LIOEQA may be set to the second logic level (e.g., a lower logic level or logic "0"). Thus, the precharge unit 20a may precharge the local input/output line LIO, LIOB to the first voltage level VBL. Then, at a given period from the start time point of active mode to a first enable time point of the column selection signal CSL (e.g., to control the column selection transistors N10 and N12), the first precharge control signal LIOPRE may be maintained at the first logic level, and the second precharge control signal LIOEQA may be maintained at the second logic level. Thus, the precharge unit 20a may precharge the local input/output line LIO, LIOB to the first voltage level VBL, which may reduce an increase of the bit line voltage level based on a charge sharing in an enabling of the column selection signal CSL and may also reduce an occurrence of failures (e.g., caused by noise, etc.). As discussed in the Background of the Invention section, conventionally, the local input/output line may be precharged to the second voltage level VINTA (i.e., not the first voltage level VBL).

In the example embodiment of FIG. 5, during the enable period of the window signal LIOEQ (e.g., a period from an enable time point or disable time point of the column selection signal CSL to a completion time point of the active mode), the first precharge control signal LIOPRE may be set to the second logic level (e.g., a lower logic level or logic "0"), and the second precharge control signal LIOEQA may be correspond to the precharge enable signal. For example, if the precharge enable signal PRECHARGE is set to the first logic level, the second precharge control signal LIOEQA may also be set to the first logic level, and vice versa.

In the example embodiment of FIG. 5, the precharge unit 20a may precharge the local input/output line LIO, LIOB to the second voltage level VINTA. During a period of from a disable time point of the column selection signal CSL to a completion time point of the active mode, if the column selection signal CSL is set to the first logic level, the precharge enable signal may transition to the second logic level (e.g., to stop a progression of the precharge operation).

In the example embodiment of FIG. 5, during a period from the completion time point of the active mode to a next start time point of a next active mode, the first precharge control signal LIOPRE may be set to the first logic level, and the second precharge control signal LIOEQA may be set to the second logic level. Accordingly, the precharge unit 20a may precharge the first local input/output line LIO, LIOB to the first voltage level VBL. In an example, the first voltage level VBL may correspond to half of the second voltage level VINTA, and may be the same voltage level as the bit line precharge voltage VBL. The second voltage level VINTA may be configured as a cell array operating voltage, and may generally be slightly less than or equal to the power source voltage. Further, the cell array operating voltage VINTA may be used to indicate the first logic level (e.g., a higher logic level or logic "1") within data stored in a memory cell. Alternatively, the second voltage level VINTA may equal the second voltage level VINTA.

Figure 6:
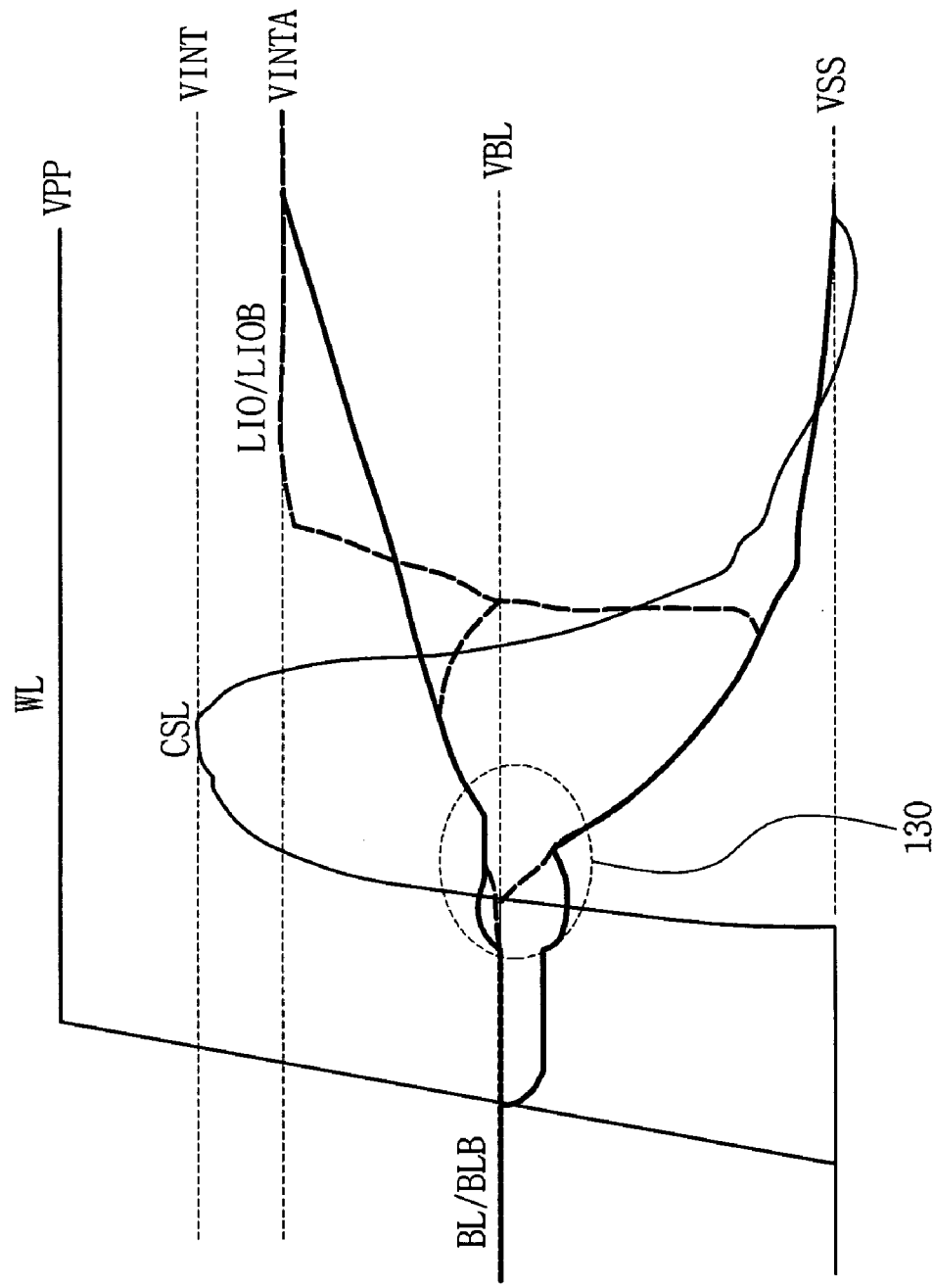
FIG. 6 illustrates a voltage level variation of a bit line and a local input/output line during a precharge and data sensing operation according to another example embodiment of the present invention.

FIG. 6 illustrates a voltage level variation of a bit line and a local input/output line during a precharge and data sensing operation according to another example embodiment of the present invention.

In the example embodiment of FIG. 6, while the word line WL is maintained at the second logic level (e.g., a lower logic level or logic "0", a disable state, etc.), bit lines BL and BLB and local input/output line LIO, LIOB may be precharged to the first voltage level VBL. If the word line WL thereafter transitions to the first logic level (e.g., a higher logic level or "1", an enable state, an active mode, etc.), the bit lines BL and BLB may be precharged, and voltage corresponding to data stored in a memory cell may be transferred to the bit lines BL and BLB, and a sense and amplification operation may be performed in a bit line sense amplifier. Thus, a voltage level difference may be generated between the main bit line BL and the sub bit line BLB. Thereby, the local input/output line LIO, LIOB may be maintained at the first voltage level VBL.

Figure 1:
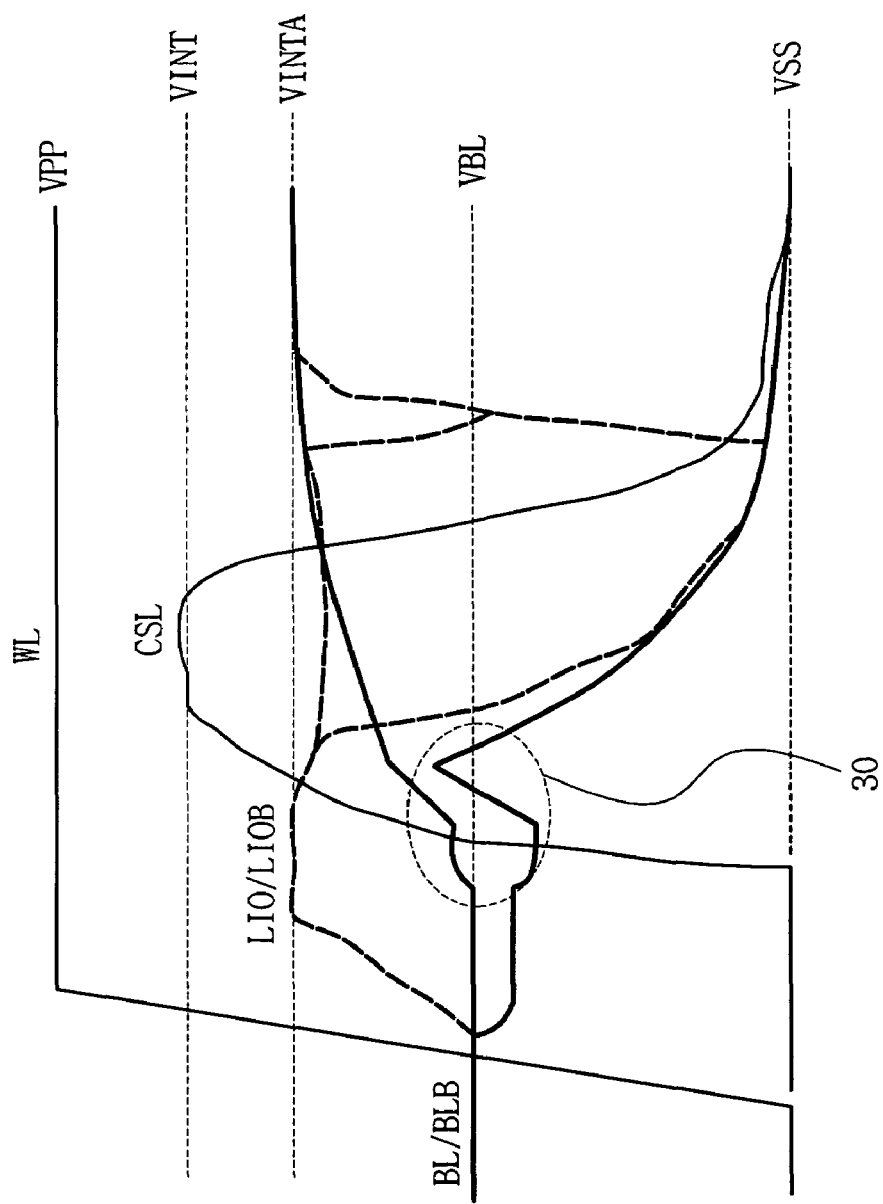
FIG. 1 illustrates a voltage level variation of a bit line and a local input/output line during a conventional precharge and data sensing operation.

In the example embodiment of FIG. 6, the first column selection signal CSL may be set to the first logic level (e.g., enabled), a precharge operation for the local input/output line LIO, LIOB may be stopped, and the bit lines BL and BLB and the local input/output line LIO LIOB may be electrically connected with each other. Data transferred to the bit lines BL and BLB and the sensed/amplified data may be transmitted to the local input/output line LIO, LIOB. A voltage level difference between the main bit line BL and the main local input/output line LIO and a voltage level difference between the sub bit line BLB and the sub local input/output line LIOB may be relatively small, as shown by reference number 130 of FIG. 6 (e.g., compared to conventional FIG. 1). Accordingly, a sensing efficiency may be enhanced and a data failure rate, based on a precharge of the local input/output line LIO, LIOB, may be reduced and/or prevented.

In the example embodiment of FIG. 6, the data transmitted to the local input/output line LIO, LIOB may be sensed and amplified in a local sense amplifier, and may thereafter be output through the global input/output line GIO, GIOB. If the column selection signal CSL, previously enabled for the data transmission, transitions to the second logic level (e.g., a lower logic level or "0", a disabled state, etc.) after a given period of time (e.g., lasting until the word line WL is disabled), the local input/output line LIO, LIOB may be precharged to the second voltage level VINTA. If a second column selection signal is enabled, a voltage level difference between the main bit line BL and the sub bit line BLB may have a difference sufficient to sense or detect, thereby reducing a probability of a failure.

In the example embodiment of FIG. 6, the precharge to the first voltage level VBL may be performed until a first column selection signal CSL is enabled. In contrast, a conventional precharge operation may precharge to the second voltage level VINTA of the local input/output line LIO, LIOB, respectively, which may cause a potentially problematic level of noise, which may affect a level of the first voltage level VBL.

In another example embodiment of the present invention, a precharge operation may precharge input/output bit lines to a first voltage level VBL until a first column selection signal CSL is enabled. After the enabling of the first column selection signal CSL, the precharge operation may augment the precharge level from the first voltage level VBL to a second voltage level VINTA. In contrast, conventional precharging operations may precharge to the second voltage level VINTA throughout an entirety of the active mode (e.g., and not from a time at which the first column selection signal CSL is enabled), thereby increasing a level of noise.

In another example embodiment of the present invention, in a precharge of local input/output lines LIO and LIOB, a period from an enable time point of a first column selection signal (e.g., after a start of an active mode) to a completion time point of the active mode may be performed for the precharge operation with a voltage level (e.g., first voltage level VBL) different from the rest period (e.g., second voltage level VINTA), thereby enhancing a sensing efficiency and preventing or reducing a probability of a data sensing failure.

Example embodiments of the present invention being thus described, it will be obvious that the same may be varied in many ways. For example, it is understood that the above-described first and second logic levels may correspond to a higher level and a lower logic level, respectively, in an example embodiment of the present invention. Alternatively, the first and second logic levels/states may correspond to the lower logic level and the higher logic level, respectively, in other example embodiments of the present invention.

Such variations are not to be regarded as a departure from the spirit and scope of example embodiments of the present invention, and all such modifications as would be obvious to one skilled in the art are intended to be included within the scope of the following claims.

What is claimed is:

1. A semiconductor memory device, comprising:
   a local input/output line connected to a bit line coupled with a memory cell, through a column selection transistor, the local input/output line providing a transmission path on which to transmit a data signal through the bit line to a local sense amplifier; and
   a local precharge circuit configured to adjust a precharge voltage level of the local input/output line based on a status of an active mode and a status of a column selection signal, wherein the local precharge circuit maintains the precharge voltage level at the first voltage level during a first period of time and the second voltage level during a second period of time, the first period of time spanning from a start point of the active mode until the column selection signal transitions to a first logic level, and the second period of time spanning from when the column selection signal transitions to a second logic level from the first logic level until an end point of the active mode.

2. The semiconductor memory device of claim 1, wherein the first voltage level is lower than the second voltage level.

3. The semiconductor memory device of claim 2, wherein the first voltage level is half that of the second voltage level.

4. The semiconductor memory device of claim 1, wherein the local precharge circuit transitions the precharge voltage level back to the first voltage level after the end point of the active mode.

5. The semiconductor memory device of claim 1, wherein the second voltage level is equal to one of a power source voltage level and an array operating voltage level.

6. The semiconductor memory device of claim 5, wherein the array operating voltage level is lower than the power source voltage level.

7. The semiconductor memory device of claim 1, wherein the local precharge circuit does not perform a precharge operation while the column selection signal is set to the first logic level during the active mode.

8. The semiconductor memory device of claim 1, wherein the active mode refers to a time period where a word line, connected to the memory cell, is enabled.

9. The semiconductor memory device of claim 1, wherein the local precharge circuit includes:
- a precharge unit configured to precharge the local input/output line to a precharge voltage level equal to one of a first voltage level and a second voltage level; and
- a precharge controller configured to control the precharge unit via at least one precharge control signal, the at least one precharge control signal based on a start time and end time of the active mode and the status of the column selection signal.

10. A local precharge circuit for precharging a local input/output line connected between a bit line and a local sense amplifier in a semiconductor memory device, comprising:
- a precharge unit configured to precharge the local input/output line to a precharge voltage level equal to one of a first voltage level and a second voltage level; and
- a precharge controller configured to control the precharge unit via at least one precharge control signal, the at least one precharge control signal based on a start time and end time of an active mode and a status of a column selection signal, wherein the precharge unit, in response to the at least one precharge control signal, maintains the precharge voltage level at the first voltage level during a first period of time and the second voltage level during a second period of time, the first period of time spanning from a start point of the active mode until the column selection signal transitions to a first logic level, and the second period of time spanning from when the column selection signal transitions to a second logic level from the first logic level until an end point of the active mode.

11. The local precharge circuit of claim 10, wherein the active mode refers to a time period where a word line, connected to a memory cell, is enabled.

12. The local precharge circuit of claim 10, wherein the first voltage level is lower than the second voltage level.

13. The local precharge circuit of claim 12, wherein the first voltage level is half that of the second voltage level.

14. The local precharge circuit of claim 10, wherein the second voltage level is equal to one of a power source voltage level and an array operating voltage level.

15. The local precharge circuit of claim 10, wherein the column selection signal is configured to control an electrical connection between the bit line and the local input/output line.

16. A method of precharging a local input/output line connected between a bit line and a local sense amplifier in a semiconductor memory device, comprising:
- adjusting a precharge voltage level of the local input/output line based on a status of an active mode and a status of a column selection signal, the active mode referring to a period where a word line is enabled, wherein adjusting the precharge voltage level includes:
- transitioning the precharge voltage level to the first voltage level during a first period of time, the first period of time spanning from a start point of the active mode until the column selection signal transitions to a first logic level; and
- transitioning the precharge voltage level to the second voltage level during a second period of time, the second period of time spanning from when the column selection signal transitions to a second logic level from the first logic level until an end point of the active mode.

17. The method of claim 16, wherein adjusting the precharge voltage level further includes:
- transitioning the precharge voltage level back to the first voltage level after the end point of the active mode.

18. The method of claim 16, wherein the column selection signal controls an electrical connection between the bit line and the local input/output line.

19. The method of claim 16, wherein the first voltage level is lower than the second voltage level.

20. The method of claim 19, wherein the first voltage level is half that of the second voltage level.

21. The method of claim 16, wherein the second voltage level is one of an array voltage level and a power source voltage, the array voltage level being lower than the power source voltage.

22. A semiconductor memory device performing the method of claim 16.

23. A local precharge circuit performing the method of claim 16.

* * * * *

UNITED STATES PATENT AND TRADEMARK OFFICE
CERTIFICATE OF CORRECTION

| | | |
|---|---|---|
| PATENT NO. | : 7,477,558 B2 | Page 1 of 1 |
| APPLICATION NO. | : 11/523052 | |
| DATED | : January 13, 2009 | |
| INVENTOR(S) | : Lee et al. | |

It is certified that error appears in the above-identified patent and that said Letters Patent is hereby corrected as shown below:

On the title page item (73) should read

(73) Assignee: Samsung Electronics Co., Ltd., Gyeonggi-do (KR)

Signed and Sealed this

Seventeenth Day of March, 2009

JOHN DOLL
*Acting Director of the United States Patent and Trademark Office*